United States Patent [19]

Mehrgardt

[11] Patent Number: 4,623,873

[45] Date of Patent: Nov. 18, 1986

[54] DIGITAL PHASE DETECTOR

[75] Inventor: Soenke Mehrgardt, March-Neuershausen, Fed. Rep. of Germany

[73] Assignee: Deutsche ITT Industries GmbH, Freiburg, Fed. Rep. of Germany

[21] Appl. No.: 736,945

[22] Filed: May 22, 1985

[30] Foreign Application Priority Data

Jun. 6, 1984 [EP] European Pat. Off. ............... 84106475

[51] Int. Cl.⁴ ............................................. H03M 1/00
[52] U.S. Cl. ............................... 340/347 SY; 364/603; 364/729
[58] Field of Search ................. 340/347 SY, 347 AD; 364/729, 603; 328/133; 375/77; 329/1

[56] References Cited

U.S. PATENT DOCUMENTS

| | | | |
|---|---|---|---|
| 3,277,461 | 10/1966 | Selvin | 340/347 SY |
| 3,825,737 | 7/1974 | Croisier | 364/603 |
| 3,956,623 | 5/1976 | Clark | 364/729 |
| 4,090,145 | 5/1978 | Webb | 329/1 |
| 4,470,147 | 9/1984 | Goatcher | 375/77 |

*Primary Examiner*—Charles D. Miller
*Attorney, Agent, or Firm*—Donald J. Lenkszus

[57] ABSTRACT

A digital phase detector for processing digital signals consisting of words containing more than 10 bits eliminates the need for a large read-only memory for arc tan values and requires only individual read-only memories for the arc tan values $2^{-r}$, where $r = 1 \ldots n$. $n-1$ like stages are provided each of which consists of an adder, a subtracter, two constant multipliers for the factor $2^{-r}$, and three changeover switches. The nth stage contains a constant multiplier for $2^{-n}$, a subtracter, and a changeover switch. The outputs of one of the changeover switches in each of the like stages and of the changeover switch in the nth stage are coupled to the inputs of a multiple-input adder whose output provides the phase detected digital signal. In a second variant of the solution, only j stages contain the above-mentioned subcircuits, while the other stages are simplified to form cells each of which contains only one constant multiplier, a subtracter with associated changeover switch, and an inverter. The outputs of this inverter are connected to the input of a register having its parallel output coupled to one of the inputs of the multiple-input adder.

2 Claims, 2 Drawing Figures

3
DIGITAL PHASE DETECTOR

BACKGROUND OF THE INVENTION

The invention pertains to a digital phase detector.

U.S. Pat. No. 4,090,145 describes in principle one digital phase detector in which an analog-to-digital converter serves to convert the analog signal to be detected into a digital signal. The circuit includes a digital 90° phase shifter, i.e., a Hilbert transformer or quadrture-signal generator, to which the digital signal is applied for forming the quadrature signal, a conditioning circuit for the digital and quadrature signals whose output provides corresponding digital quadrant signals $x'$, $y'$ belonging to the first $x'$-$y'$ coordinate system half-quadrant, and a circuit delivering the arc-tan function of the quotient $y'/x'$ and containing a read-only memory.

In this arrangement, the storage space needed in the read-only memory depends on the desired resolution of the analog-to-digital converter, i.e., on the number n of bits of the digital words to be processed; $2^{2n}$ memory locations (bits) are needed.

For the digital processing of video signals having words containing n=6 to 8 bits, $2^7$ to $2^9$ locations of the read-only memory are thus required. This requirement can be readily fulfilled with state-of-the-art semi-conductor technology. However, digital words containing more bits, e.g., n=13 to 17, as are desirable for the digital processing of audio signals, for example, require storage space for $2^{14}$ to $2^{18}$ bits, so that the chip area occupied by an integrated circuit containing the digital phase detector would be prohibitively large, i.e., with today's semi-conductor technology, such a chip could not be implemented at justifiable expense.

SUMMARY OF THE INVENTION

One object of the invention as claimed is to provide a digital phase detector of the above kind which allows digital signals, particularly signals consisting of words containing more than 10 bits, to be detected without requiring a large storage space in the read-only memory.

The essential advantage of the invention lies in the fact that in the first variant of the solution, only $n^2$ memory locations, distributed among n small read-only memories, are needed, and that in the second variant of the solution, this memory location requirement is again reduced to between one quarter and one half.

BRIEF DESCRIPTION OF THE DRAWING

The invention will be better understood from a reading of the following detailed description in conjunction with the drawing in which.

DETAILED DESCRIPTION

Figure 1:
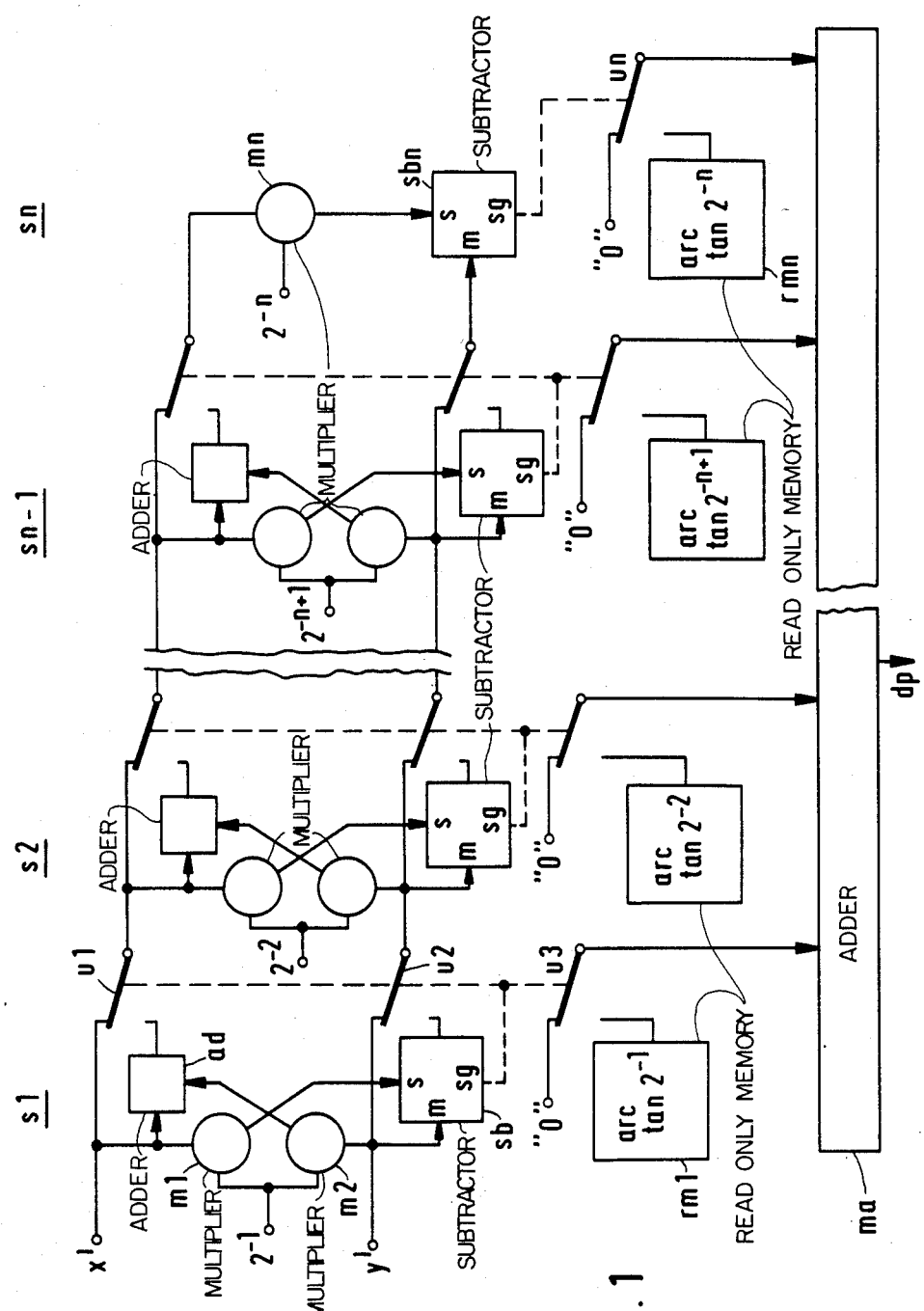
FIG. 1 is a block diagram of first variant of the solution.

The block diagram of FIG. 1 shows a first embodiment of the invention. The input signals are the above-mentioned, suitably conditioned quadrant signals $x'$, $y'$, which can be generated with the arrangement described in the above-mentioned U.S. Patent, for example. The arc-tan signal corresponding to the quotient $y'/x'$, i.e., the angle between the abscissa and the vector formed by $x'$, $y'$ in the $x'$-$y'$ coordinate system, thus covers the first half-quadrant of this system, i.e., the angle between 0° and 45°. Because of the periodicity of the tangent function, the corresponding output signals dp for angles greater than 45° can be generated with the prior art conditioning circuit, too.

The first variant of the solution, shown in FIG. 1, includes n−1 like stages s1, s2, sn−1, and the nth stage sn, whose design is slightly different from that of the other stages. n is the maximum number of predetermined bits of one of the quadrant signals $x'$, $y'$. Each of the like stages s1 ... sn−1 consists of the adder ad, the subtracter sb, the first and second constant multipliers m1 and m2 for the factor $2^{-r}$, where r is equal to 1 ... n−1, the first, second, and third electronic changeover switches u1, u2, u3, and the read-only memory rm1 for arc tan $2^{-r}$, i.e., only for the arc-tan value $2^{-r}$, a read-only memory occupying a correspondingly small chip area must be provided in each stage.

In the first stage s1, the quadrant signal $x'$, and in each of the other stages s2 ... sn−1, the outpout of the first switch u1 of the preceding stage are coupled to the first inputs of the adder ad, the first constant multipliers m1, and the first switch u1.

In the first stage s1, the second quadrant signal $y'$, and in each of the other stages s2 ... sn−1, the output of the second switch u2 of the preceding stage are coupled to the first inputs of the second constant multiplier m2 and the second switch u2 and to the minuend input m of the subtracter sb. The output of the second constant multiplier m2 is connected to the second input of the adder ad, and the output of the first constant multiplier m1 to the subtrahend input s of the subtracter sb. The output of the adder ad is coupled to the second input of the first switch u1, and that of the subtracter sb to the second input of the second switch u2, while the first input of the third switch u3 is presented with the number zero, "0", and the second input of this switch is connected to the output of the read-only memory rm1. The output of the third switch u3 is coupled to one of the n inputs of the multiple-input adder ma. The sign output sg of the subtracter sb of each stage is connected to the control inputs of the three switches u1, u2, u3 of the stage, and the combinatorial assignment is chosen so that the first input of the respective switch is connected to the output when the sign is negative, while the second input of the respective switch is connected to the output when the sign is positive.

The nth stage sn includes the constant multiplier mn for the factor $2^{-n}$, which has its first input connected to the output of the first switch u1 of the (n−1)th stage sn−1, the subtracter sbn, whose minuend input m is connected to the output of the second switch u2 of the preceding stage sn−1 and whose subtrahend input s is connected to the output of the constant multiplier mn, the switch un, whose first input is presented with the number zero, "0", and the read-only memory rmn for arc tan $2^{-n}$, whose output is coupled to the second input of the switch un, which has its output coupled to the multiple-input adder ma, while its control input is connected to the sign output sg of the subtracter sbn.

Figure 2:
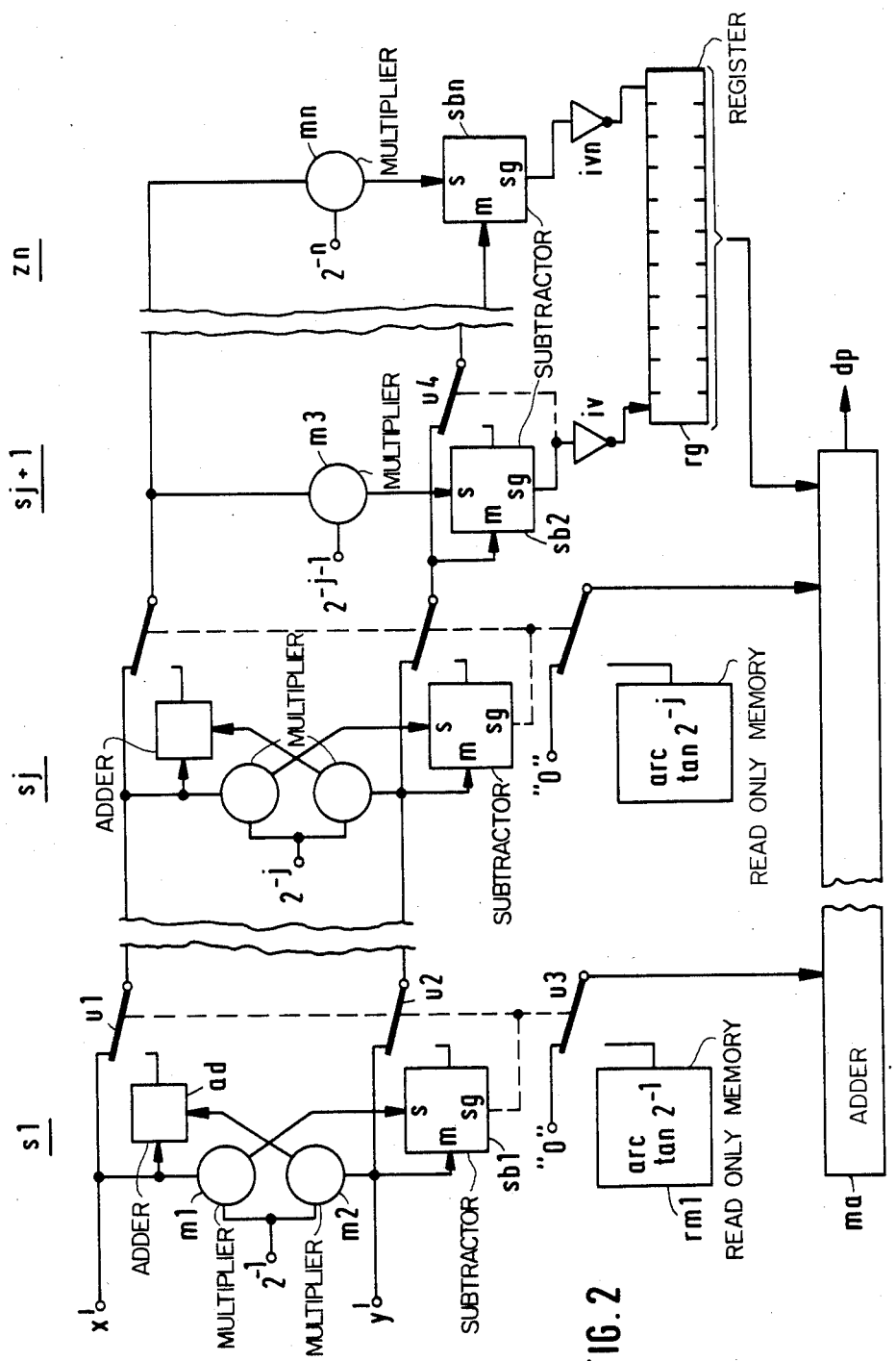
FIG. 2 is a block diagram of a second variant of the solution.

The second variant of the solution, shown in FIG. 2, differs from the first variant of FIG. 1 essentially in that from a stage j+1, where j can be an integer between 4 and 8, the read-only memory rm1 of FIG. 1 has been omitted, because for arguments $2^{-j}$, the associated tangent value can be replaced by the argument itself with sufficient accuracy. The first j stages of the arrangement of FIG. 2 are therefore identical in design to the corresponding stages s1 ... sn−1 of the arrangement of FIG. 1, with the subtracter sb of FIG. 2 now defined as the first subtracter sb1.

Instead of the n−j−1 like stages of FIG. 1, the second variant of the solution, shown in FIG. 2, contains n−j−1 like cells, and instead of the nth stage of FIG. 1, it contains the (n−j)th cell zn. The arrangement of FIG. 2 further includes the (n−j)-stage register rg, whose parallel output is connected to one of the inputs of the multiple-input adder ma. Unlike in the arrangement of FIG. 1, where it has n inputs and, thus, has to perform n−1 additions, the multiple-input adder m1 has only j+1 inputs for j additions, so it occupies less chip area than in FIG. 1.

Each of the like cells, of which the cell sj+1 is shown in FIG. 2, consists of the third constant multiplier m3 for the factor $2^{-r}$, whose first input is connected to the output of the first switch u1 of the jth stage sj, the fourth switch u4, whose first input is connected in the (j+1)th cell to the output of the second switch u2 of the jth stage sj and in each of the following cells to the output of the fourth switch u4 of the preceding cell, the second subtracter sb2, whose minuend input m and subtrahend input s are connected, respectively, to the first input of the fourth switch u4 and the output of the third constant multiplier m3, and whose output is coupled to the second input of the fourth switch u4, while its sign output sg is connected to the control input of the fourth switch u4, and the inverter iv, which has its input connected to the sign output sg of the fourth switch u4. In the above factor $2^{-r'}$, r' is equal to j+1 ... n−1.

In this variant, like in that of FIG. 1, the first input of each of the switches u1, u2, u3 (in the stages s1...sj) and u4 (in the cells) is connected to the output when the sign at the sign output sg of the associated subtracter sb1, sb2 is negative, and the second input of each of these switches is connected to the output when the sign at the sign output sg is positive.

The (n−j)th cell zn consists of the constant multiplier mn for the factor $2^{-n}$, whose first input is connected to the output of the first switch u1 of the jth stage sj, the subtracter sbn, whose minuend input m and subtrahend inut s are connected to the outputs of the fourth switch u4 and the constant multiplier mn, respectively, and the inverter ivn, which has its input connected to the sign output sg of the subtracter sbn.

The outputs of all inverters iv, ivn are connected to the stage inputs of the register rg according to their weights, and the parallel output of the register rg is coupled to one of the inputs of the multiple-input adder ma. The output of the latter provides the digital phase-detected signal dp, which lies in the first half-quadrant of the x'-y' coordinate system, i.e., between 0° and 45°.

In the figures of the drawing, the interconnecting leads are shown only as simple lines, regardless of the circuit implementation. However, this is not to be understood as a limitation; parallel processing of the quadrant signals x', y' is also possible. In such a case, the interconnecting leads are conventional buses whose number of parallel wires is adapted to the number n of bits of the digital words to be processed. In this case, the adders, subtracters, multipliers, and changeover switches are corresponding parallel processing units. Such an implementation will be chosen if fast signal processing is required, in which case the overall arrangement will be implemented by the so-called pipeline technique.

If high signal processing speed is not so important, the two variants of the solution according to the invention can be simplified by using multiplex techniques, i.e., the total number of stages and cells is smaller than the number n of bits of the quadrant signals x', y', and the cells are traversed several times during each processing cycle.

The two variants of the solution according to the invention are based on the consideration that, with the two substitutions u=x'+by'; v=x'−by', the phase angle dp can be defined by the relation dp=arc tan u/v +arc tan b, where b is equal to $2^{-r}$ if the invention is implemented with binary circuits. The invention is also based on the recursive application of the last-mentioned relation.

The invention is suitable for implementation as an integrated circuit, particularly as a so-called MOS circuit, i.e., an insulated-gate field-effect transistor circuit. Specific applications of the invention in audio systems are the detection of AM stereo-broadcast signals, the detection of television sound signals, and the detection of VHF broadcast signals. The invention can also be used for SECAM chrominance demodulation and in magnetic picture recording, e.g., in video recorders.

What is claimed is:

1. A digital phase detector comprising:
   an analog-to-digital converter for converting analog signals to be detected into digital signals, said analog-to-digital converter being clocked by a clock signal;
   a digital 90° phase shifter receiving said digital signals and forming quadrature signals;
   a conditioning circuit for said digital signals and said quadrature signals, the output of said conditioning circuit providing corresponding digital quadrature signals (x', y') which lie in the first half quadrant of an x'- y' coordinate system;
   n−1 like stages where n=the maximum number of predetermined bits of one of said quadrature signals (x', y'), each of said n−1 like stages comprising:
   first and second input terminals,
   first and second output terminals,
   a first electronic transfer switch having a first input coupled to said first input terminal and an output coupled to said output terminal,
   a second electronic transfer switch having a first input coupled to said second input terminal and an output coupled to said second output terminal,
   first and second constant multipliers for multiplying an input by a factor $2^{-r}$ where r is the number of the stage from, said first constant multiplier having an input coupled to said first input terminal and having an output, said second constant multiplier having an input coupled to said second input terminal and having an output,
   an adder having a first input coupled to said second constant multiplier output, a second input coupled to said first input terminal, and an output coupled to a second input of said first electronic transfer switch,
   a first subtracter having a minuend input coupled to said second input terminal, a subtrahend input coupled to said first constant multiplier output, an output coupled to a second input of said second electronic transfer switch, and having a sign output, a read only memory for arc tan $2^{-r}$, where r is the number of the stage from 1 to n−1, a stage output, a third electronic transfer switch having a first input receiving a predetermined number, a second input coupled to the output of said read only memory, and an output coupled to said stage output, the sign output of said subtracter being coupled to and controlling said first, second and third electronic transfer switches;

the first and second input terminals of the first one of said n−1 stages respectively receiving a first one of said quadrant signals (x') and a second one of said quadrant signals (y');

the first and second input terminals of the second and all subsequent ones of said n−1 like stages being coupled to the first and second output terminals, respectively, of the preceeding one of said n−1 stages;

an nth stage having first and second inut terminals coupled to the first and second output terminals, respectively, of the n−1$^{th}$ one of said n−1 stages, said n$^{th}$ stage comprising:

an additional constant multiplier for multiplying an input by $2^{-n}$, said additional constant multiplier having an input coupled to said n$^{th}$ stage first input terminal, an additional subtracter having a minuend input coupled to said n$^{th}$ stage second input terminal, an input coupled to the output of said additional constant multiplier, and having a sign output, an nth stage output terminal, a read only memory for arc tan $2^{-n}$, an additional electronic transfer switch having a first input receiving a predetermined number, a second input coupled to said additional read only memory, an output coupled to said n$^{th}$ stage output terminal, and a control input coupled to said additional subtracter sign output; and a multiple input adder having inputs coupled to said stage outputs and said n$^{th}$ stage output, the output of said multiple input adder providing the digital phase-detected signal of the first half quadrant of said coordinate system.

2. A digital phase detector comprising:

an analog-to-digital converter for converting analog signals to be detected into digital signals, said analog-to-digital converter being clocked by a clock signal;

a digital 90° phase shifter receiving said digital signals and forming quadrature signals;

a conditioning circuit for said digital signals and said quadrature signals, the output of said conditioning circuit providing corresponding digital quadrature signals (x', y') which lie in the first half quadrant of an x'- y' coordinate system;

j like stages where n=the maximum number of predetermined bits of one of said quadrature signals (x', y') and j is a predetermined number less than n, each of said j like stages comprising:

first and second input terminals, first and second output terminals, a first electronic transfer switch having a first input coupled to said first input terminal and an output coupled to said output terminal, a second electronic transfer switch having a first input coupled to said second input terminal and an output coupled to said second output terminal, first and second constant multipliers for multiplying an input by a factor $2^{-r}$ where r is the number of the stage from, said first constant multiplier having an input coupled to said first input terminal and having an output, said second constant multiplier having an input coupled to said second input terminal and having an output, an adder having a first input coupled to said second constant multiplier output, a second input coupled to said first input terminal, and an output coupled to a second input of said first electronic transfer switch, a first subtracter having a minuend input coupled to said second input terminal, a subtrahend input coupled to said first constant multiplier output, an output coupled to a second input of said second electronic transfer switch, and having a sign output, a read only memory for arc tan $2^{-r}$, whee r is the number of the stage from 1 to n−1, a stage output, a third electronic transfer switch having a first input receiving a predetermined number, a second input coupled to the output of said read only memory, and an output coupled to said stage output, the sign output of said subtracter being coupled to and controlling said first, second and third electronic transfer switches;

the first and second input terminals of the first one of said n−1 stages respectively receiving a first one of said quadrant signal (x') and a second one of said quadrant signals (y');

the firt and second input terminals of the second and all subsequent ones of said j like stages being coupled to .the first and second output terminals, respectively, of the preceeding one of said j stages;

n−j−1 like additional stages, each additional stage comprising:

first and second input terminals, first and second output terminals, an additional stage output a third constant multiplier for the factor $2^{-r'}$ where r'=j+1 to n−1, having its input coupled to said additional stage first input, said additional stage first input also coupled to said additional stage first output, a fourth electronic transfer switch having a first input coupled to said additional stage second input, and having an output coupled to said additional stage second output, a second subtractor having its minuend input coupled to said additional stage second input, its subtrahend input coupled to the output of said third constant multiplier output, an output coupled to a second input of said fourth electronic transfer switch, and a sign output for controlling said fourth electronic transfer switch, said sign output being coupled to said additional stage output, said first and second input terminals of said n−j−1 like additional stages being coupled to the first and second output terminals, respectively, of the prior stage;

an nth stage having first and second input terminals coupled to the first and second output terminals, respectively, of the $n-j-1^{th}$ one of said $n-j-1$ stages, said $n^{th}$ stage comprising:

a further constant multiplier for multiplying an input by $2^{-n}$, said further constant multiplier having an input coupled to said $n^{th}$ stage first input terminal, a further subtracter having a minuend input coupled to said $n^{th}$ stage second input terminal, one input coupled to the output of said further constant multiplier, and having a sign output, an $n^{th}$ stage output terminal coupled to said further subtracter sign output, a register having inputs coupled to the outpouts terminals of each said additional stage and said $n^{th}$ stage, said register having outputs, a multiple input adder having inputs coupled to said stage outputs and to said register outputs, the output os said multiple input adder providing the digital phase-detected signal of the first half quadrant of said coordinate systems.

* * * * *